United States Patent
Branch et al.

(10) Patent No.: US 7,650,549 B2
(45) Date of Patent: Jan. 19, 2010

(54) DIGITAL DESIGN COMPONENT WITH SCAN CLOCK GENERATION

(75) Inventors: Charles M. Branch, Dallas, TX (US); Steven C. Bartling, Plano, TX (US); Marc Edward Royer, Garland, TX (US); Cory Dean Stewart, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 574 days.

(21) Appl. No.: 11/174,193

(22) Filed: Jul. 1, 2005

(65) Prior Publication Data

US 2007/0022339 A1  Jan. 25, 2007

(51) Int. Cl.
*G01R 31/317* (2006.01)
*G01R 31/40* (2006.01)

(52) U.S. Cl. ...................... 714/731; 714/724

(58) Field of Classification Search ............... None
See application file for complete search history.

(56) References Cited

U.S. PATENT DOCUMENTS

| | | | |
|---|---|---|---|
| 5,721,740 A * | 2/1998 | Moon et al. | 714/731 |
| 6,381,704 B1 * | 4/2002 | Cano et al. | 713/600 |
| 6,693,460 B2 * | 2/2004 | Kanba | 326/93 |
| 6,864,733 B2 * | 3/2005 | Anshumali et al. | 327/210 |
| 7,200,784 B2 * | 4/2007 | Dervisoglu et al. | 714/731 |
| 2003/0093734 A1 * | 5/2003 | Zhang et al. | 714/731 |
| 2005/0229059 A1 * | 10/2005 | Hirano | 714/726 |

* cited by examiner

*Primary Examiner*—Kevin L Ellis
*Assistant Examiner*—Dipakkumar Gandhi
(74) *Attorney, Agent, or Firm*—John J. Patti; Wade J. Brady, III; Frederick J. Telecky, Jr.

(57) ABSTRACT

A master and a slave stage of a flip-flop are each separately clocked with non-overlapping clock signals during scan mode to eliminate a data input scan mode multiplexer. Separate, non-overlapping clocking permits the elimination of hold violations in scan mode for scan mode flip flop chains, permitting the elimination of delay buffers in the scan mode data paths. Resulting application circuits have reduced circuit area, power consumption and noise generation. A clock generator for scan mode clocking is provided to obtain the separate, non-overlapping scan mode clocks. Scan mode clocks may be generated with a toggle flip flop, a pulse generator or a clock gating circuit.

28 Claims, 11 Drawing Sheets

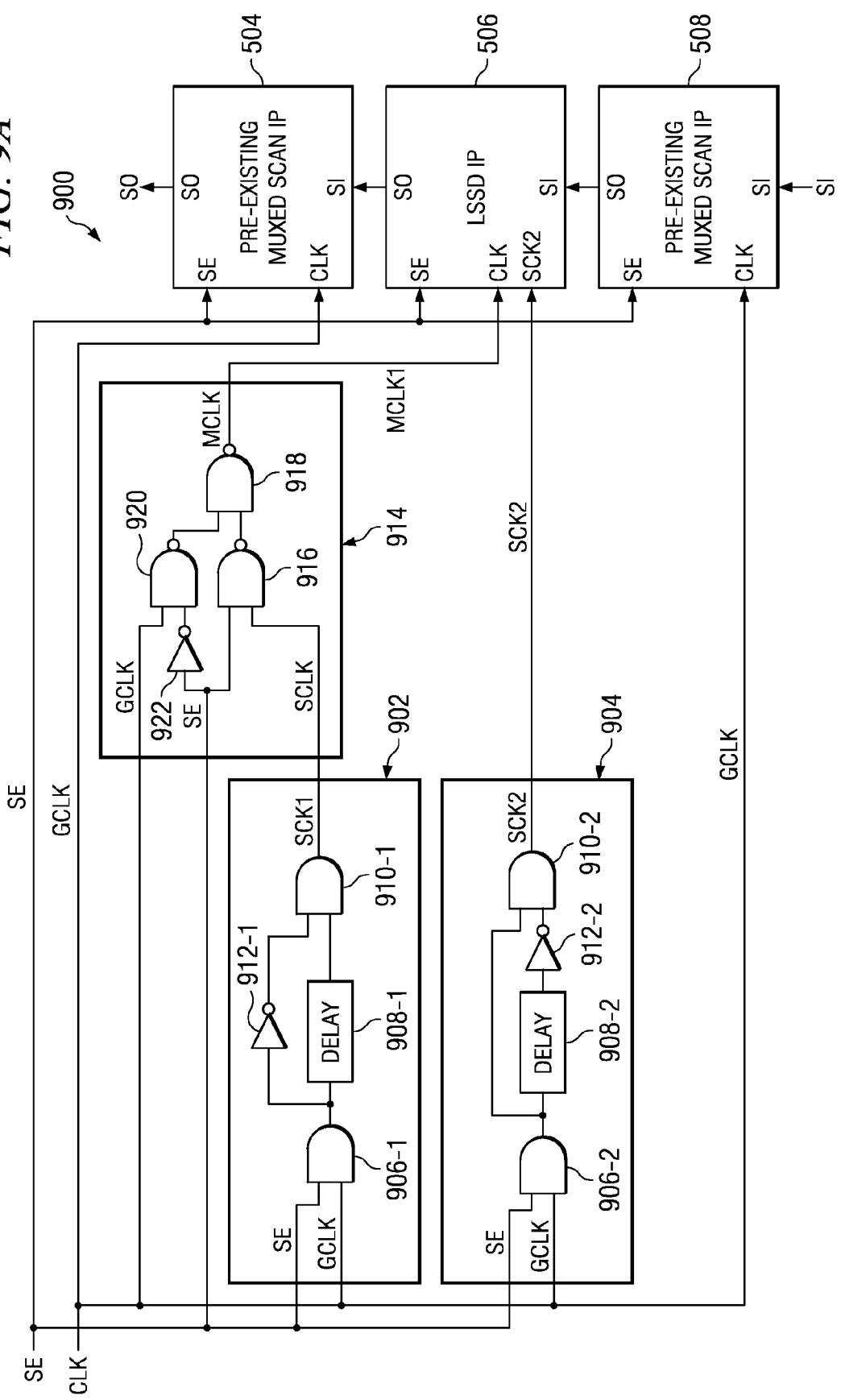

DIGITAL DESIGN COMPONENT WITH SCAN CLOCK GENERATION

TECHNICAL FIELD

The present invention relates generally to a digital design component used in the design of high level digital circuits, and relates more particularly to a flip-flop design element and scan clock generation therefor.

BACKGROUND

In the implementation of digital design systems or application specific integrated circuits (ASIC), one important criteria is timing closure associated with the various interconnected design components. High performance designs benefit from increased implementation efficiency to obtain higher frequency targets in a resulting circuit. High frequency operation implies the use of fewer gates between flip-flops and an increasing use of pipelining techniques. Pipeline techniques permit higher operating frequencies by breaking up paths into one or more states separated by flip-flops. The use of pipelining techniques typically increases the number of sequential cells used in a design. Accordingly, the realization of high frequency designs focuses on providing more efficient sequential cells that allow rapid timing closure during chip implementation.

A traditional multiplexed scan flip-flop design has a number of characteristic features associated with the system level implementation of the design. The efficiency of sequential cells is traditionally measured through observation of parameters such as data set up time, clock to "Q" delay, data hold time and cell area. The operating frequency of a chip is typically limited by intrinsic delays, setup times and tolerance variations in clock duty cycles. One measure to determine the limitations on the chip operating frequency is to observe the minimum operating clock as a sum of delays, setup times and tolerance variations. The following equation provides one measure of determining a minimum operating clock.

$$\text{TCLK\_MIN} = \Delta T_{CLK\_Q} + \Delta Tg + \Delta t\text{setup} + \text{CLK\_SKEW} + \text{CLK\_JITTER} \quad (1)$$

Where:
$\Delta T_{CLK\_Q}$=flip-flop clock-to-Q output delay
$\Delta Tg$=path gate delays plus RC
$\Delta T\text{setup}$=flip-flop data to clock setup time
CLK_SKEW=the variation in clock tree insertion delay and OCV induced clock insertion delay differences
CLK_JITTER=duty cycle variations (cycle to cycle).

Traditional sequential cell design focuses on optimization of cell area, $\Delta T_{CLK\_Q}$ and $\Delta T$setup. However, at a system level, optimization of the clock period focuses on the minimization of each term in the minimum clock period of equation (1).

Referring to FIG. 1, a conventional flip-flop 100 is shown. The flip-flop 100 generally comprises a multiplexer 102, transparent latches 104, and inverters 124 and 126. The latches 104 are generally comprised of inverters 106, 108, 110, 112, 114, and 116 and transmission gates 118 and 120. Multiplexer 102 is provided at an input to the latches 104 to permit selection between functional data D and scan data SD. The presence of multiplexer 102 has an impact on the $\Delta Tg$ term, which can be viewed from different perspectives with respect to path optimization. First, multiplexer 102 may be viewed as increasing the data path delay of the functional mode data. Second, multiplexer 102 may be viewed as consuming one gate delay of paths gate delay budget. Third, multiplexer 102 may be viewed as increasing the setup time for the flip-flop. In either case, optimization of the minimum clock period is influenced by the presence of multiplexer 102. In addition, multiplexer 102 increases power consumed in functional mode when both the functional and scan data input toggle when the flip-flop 100 changes logic states.

Additionally, turning to FIG. 2, a circuit 200 having several scan logic paths. Each path generally comprises a flip-flop 100-1 to 100-3 and scan path delay buffers 204-1 to 204-3 (respectively). As can be seen in the third path, though, a scan signal regeneration buffer 202 and a scan path delay buffers 202 are connected to a scan multiplexer of a downstream flip-flop 100-4. The path is impacted by the scan logic as illustrated by $\Delta T_g$ delay 206. When upstream flip-flop 100-3 changes state, the scan path logic switches in relation to downstream flip-flop 100-4 thereby consuming additional power.

Another difficulty is observed in the potential race conditions when the same the clock edge is used to both launch and capture data. When the $\Delta T_{CLK\_Q}$ and $\Delta T$setup delay values are minimized to increase operating frequency, there is an increased probability that two back-to-back flops can experience data race-through problems. Race-through occurs whenever an upstream flip-flop launches data before the downstream flip-flop stops capturing data. This effect is observed as a data hold time violation on the data input of the downstream input of the flip-flop. In addition, clock skew between launching and capturing flops often creates and/or exacerbates hold time violations. Furthermore, scan chain reordering is often conducted to reduce routing congestion in the chip. However, scan chain reordering has the potential to create a large set of scan mode hold violations, since scan data would then be routed to the closest possible flip-flop. The shorter routes lead to less propagation delay which in turn lead to higher likelihood of scan mode hold violations.

While hold violations can occur in any functional operating mode, the greatest number of violations typically occur during scan shift/capture modes. The number of hold violations induced by scan chain reordering can be potentially enormous. Hold violations are usually fixed with the insertion of delay buffers in the path containing the hold violation. The delay buffers (such as delay buffers 204-1 to 204-3 of FIG. 2) are cells that are specially designed to have a greater than normal intrinsic cell delay. Accordingly, the delay buffers (such as delay buffers 204-1 to 204-3 of FIG. 2) are typically inserted through design software, or automatically, in the hold violation path prior to the flip-flop that has the hold violation. Typically, the insertion of the delay buffers (such as delay buffers 204-1 to 204-3 of FIG. 2) occurs immediately before the hold violation flip-flop. When the delay buffers (such as delay buffers 204-1 to 204-3 of FIG. 2) are inserted before the receiving flip-flop, all the timing arcs that terminate in the data input port of the flip-flop with the hold violation are delayed. Accordingly, the introduction of delay buffers (such as delay buffers 204-1 to 204-3 of FIG. 2) to overcome hold time violations has an impact on the entire system.

The drawbacks that typically occur with the insertion of delay buffers (such as delay buffers 204-1 to 204-3 of FIG. 2) include additional usage of chip area, an increase in routing congestion, diminished signal integrity through increased cross talk and increased power consumption. Any of these drawbacks also can trigger additional implementation or timing closure iterations that add to the implementation costs of the circuit. The addition of a large number of hold buffers results in an increase in chip area.

Scan logic also consumes a certain amount of power during normal functional mode operation, and circuit designs typically take into account routing and connectivity of scan logic paths and their impact on paths and operation of the normal functional mode logic. Conventionally, flip-flops with a multiplexed scan inputs often reuse the primary flip-flop data output such as "Q" and/or "QB" to propagate the scan data input to the next flip-flop in the scan logic chain. The reused outputs often result in metal routing and buffers in the scan data path that create parasitic loads on the paths that can impact path delays in the circuit. One technique to overcome parasitic loading, calls for a dedicated scan output in the flip-flop architecture. Such a technique is implementation sensitive and a $\Delta T_{CLK\_Q}$ delay may be difficult to avoid in the path of the flip-flop. Scan logic implemented in a conventional flip-flop also typically has metal routing that is associated with the slave stage of the flip-flop to take advantage of some of the architectural features of the flip-flop. Accordingly, conventional scan logic draws power in the flip-flop operation during normal operating mode because the scan logic path toggles when the slave stage of the flip-flop changes state. Power consumption in the scan logic is also observed with a series of flip-flops where the scan logic path switches with every change in an upstream flip-flop state.

SUMMARY

In accordance with the present invention, a flip-flop architecture with scan mode functionality eliminates scan mode hold violations and reduces chip area consumed, power consumed, noise generated and path delays for application architectures using the flip-flop design. The elimination of hold violations in scan mode permits the removal or omission of scan mode path delay buffers. The separation of various functions according to different modes in the architecture permits scan mode logic and functional mode logic to be independent so that operation of one mode path does not induce toggling or power consumption in another mode path.

The flip-flop architecture has a master-slave configuration to permit independent capture and output of data. In functional mode, each of these stages is clocked with the same functional mode clock. In scan mode, however, the master and slave stages are clocked separately. During scan mode, a scan mode clock provides the master stage clocking and the functional mode clock provides the slave stage clocking. The two clocks are non-overlapping, so that the duty cycle of both clocks together is less than a full clock period. Each clock signal has pulses that coincide with low states in the other clock signal. For example, both clocks may have duty cycles that together add up to less than 100%, such as less than 80%-20% or 50%-50%, respectively. The arrangement of non-overlapping clocks avoids the master latch and the slave latch being transparent, or passing data, at the same time. The functional mode clock is disabled with respect to the master stage during scan mode, and provided to the slave stage for output clocking in scan mode. The scan mode clock is enabled and applied to the master stage during scan mode, and otherwise inactive in functional mode. A feedback clocked inverter in the master stage is disabled by whichever clock is active, the functional clock or the scan clock.

The slave stage of the flip-flop architecture is provided with a gated scan mode output to permit independent scan data propagation. Accordingly, the scan data output is not active during functional mode so that scan logic is not toggled during functional mode. The separate, non-overlapping clocks used during scan mode eliminate scan mode hold violations in the flip-flop scan chain. Accordingly, the flip-flop architecture of the present invention permits savings in circuit area through the omission of scan mode delay buffers. A main difference between the flip-flop architecture of the present invention and that of prior designs is the additional scan mode clock input used in the flip-flop design of the present invention. The provision of the additional clock to the flip-flop permits significant advantages in flip-flop architecture and overall system design, as discussed above, and in greater detail below. In addition, the scan mode clocks may be generated according to a number of techniques.

According to an embodiment of the present invention, there is provided a flip-flop architecture including a master stage for receiving an input and a slave stage for proving an output. A plurality of clocking signals is selectively applied to the master stage to clock the master stage. A selection signal is provided to the flip-flop and applied to select one or more of the clocking signals. Different clocking signals may be applied to the master stage in dependence on a state of the selection signal.

According to another embodiment of the present invention, there is provided a flip-flop architecture with a scan mode data path clocked by a scan mode clock. A functional clock clocks a functional data path. The flip-flop includes a master stage including a clocked inverter selectively clocked with the functional mode clock or the scan mode clock. A slave stage is coupled to the master stage and clocked with the functional mode clock. A selection signal coupled to at least one of the clock signals selectively disables the clock signal to the master stage.

In accordance with another embodiment of the present invention, there is provided a method for operating a flip-flop. The method includes selecting a test mode for testing flip-flop operation and clocking a master stage of the flip-flop with a first clock signal during test mode. The method provides for selecting a normal functional mode for normal functional operation of the flip-flop and clocking the master stage of the flip-flop with a second clock signal during normal mode operation.

According to an embodiment of the present invention, non-overlapping scan mode clocks are generated with a clock gating system that selectively gates a clock signal to a desired destination. A system clock and a test clock are gated with test mode criteria to obtain a gated clock used to operate the slave stage of a series of flip-flops in scan mode, and a scan clock used to operate the master stage of the flip-flop according to the present invention in scan mode.

According to another embodiment of the present invention, a gated clock is provided to a scan clock pulse generator that provides the scan clock that operates the master stage in scan mode. The gated clock is based on a system clock or test clock, dependent upon test parameter signals that determine clock selection.

According to another embodiment of the present invention, non-overlapping scan clocks are generated using an input clock to create an event that is synchronized to a high-speed reference clock. In an exemplary embodiment, the high-speed reference clock operates four times faster than a given scan clock. It should be apparent that whole or fractional multiples of the scan clock speed may be used in the formation of the high-speed reference clock. The reference clock may be created with an on-chip Phase-Locked Loop (PLL) or supplied externally, and need not be synchronized with the input clock. The event is used to cause a state machine to operate that allows a single pulse of the higher speed clock to propagate to a first scan clock, followed by one or more low cycles. The state machine then permits a single pulse to be presented to a second scan clock, followed by one or more low cycles. In this exemplary embodiment, there are four high-speed clock pulses for every pulse of the scan clocks. Scan clock pulses can be generated on any of the reference clock edges, as long as they are non-overlapping. For example, a first scan clock can be generated based on the third rising clock edge of the reference clock, while a second scan clock can be generated on the first rising clock edge.

According to another embodiment of the present invention, the non-overlapping scan clocks are generated from a gated clock, with one scan clock used for the slave stage, and one clock used for the master stage during scan mode in the flip-flop according to the present invention. The non-overlapping scan mode clocks can be configured to permit a large degree of tolerance in the clock distribution, such as may be needed in the presence of a large amount of clock skew. According to a feature of the present invention, the non-overlapping scan mode clocks are generated with one pulse each per gated clock cycle. With this clocking scheme, scan mode testing can proceed at the test clock frequency.

In accordance with a preferred embodiment of the present invention, an apparatus is provided. The apparatus comprises a master stage that is adapted to receives a clock signal, a data signal, a enable signal, a scan data signal, and a scan clock signal, wherein the master stage includes: clock input logic that receives the enable signal and the clock signal; a first multi-state circuit that receives the data signal and that is coupled to the clock input circuit, wherein the clock input circuit controls the first multi-state circuit; scan clock input logic that receives the scan clock signal; a second multi-state circuit that receives the scan data signal and that is coupled to the clock input logic, wherein the scan clock input logic controls the second multi-state circuit; and a control circuit that is coupled to the first and second multi-state circuits; and a slave stage including: input circuit that is coupled to the control circuit and that receives the clock signal; output logic that is coupled to input circuit and that provides a scan mode output.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 9A and 9B are circuit block diagrams illustrating examples of scan clock generation circuitry in accordance with a preferred embodiment of the present invention;

DETAILED DESCRIPTION

Figure 1:
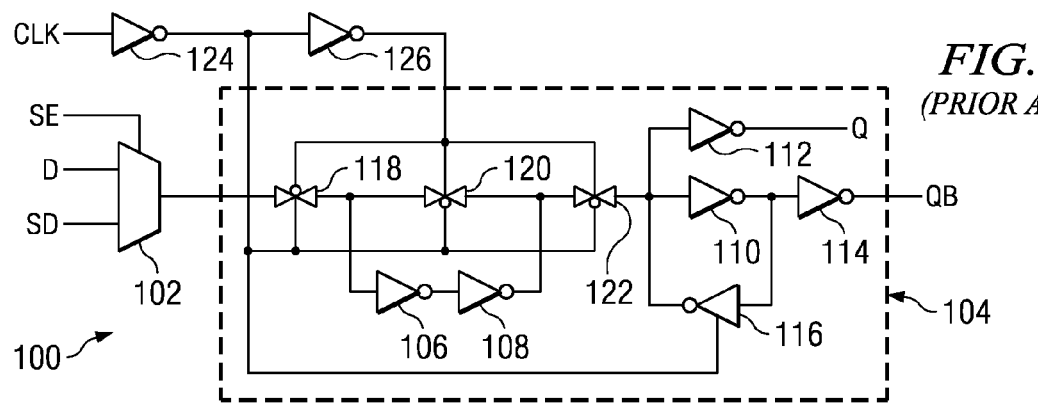
FIG. 1 is a circuit block diagram of a conventional flip-flop.

Refer now to the drawings wherein depicted elements are, for the sake of clarity, not necessarily shown to scale and wherein like or similar elements are designated by the same reference numeral through the several views.

Referring to FIGS. 3A to 3F, each of reference numerals 300-1 to 300-6 generally designate a positive edge triggered flip-flop in accordance with a preferred embodiment of the present invention. Each of flip-flops 300-1 to 300-6 generally comprises a master stage 302-1 to 302-6 (respectively) and a slave stage 304-1 to 304-6 (respectively) that are coupled to one another. Each master stage 302-1 to 302-5 generally comprises transistors Q1 through Q6, NOR gate 306, and inverters 308, 312, 314, and 316. Each of slave stages 304-1 to 304-6 generally comprises inverters 318 and 322, transmission gate 320, tri-state buffer or inverter 324, and NAND gate 326. Additionally, in each of the flip-flops 300-1 to 300-6, signals SQ represents the scan mode output.

Figure 3A:
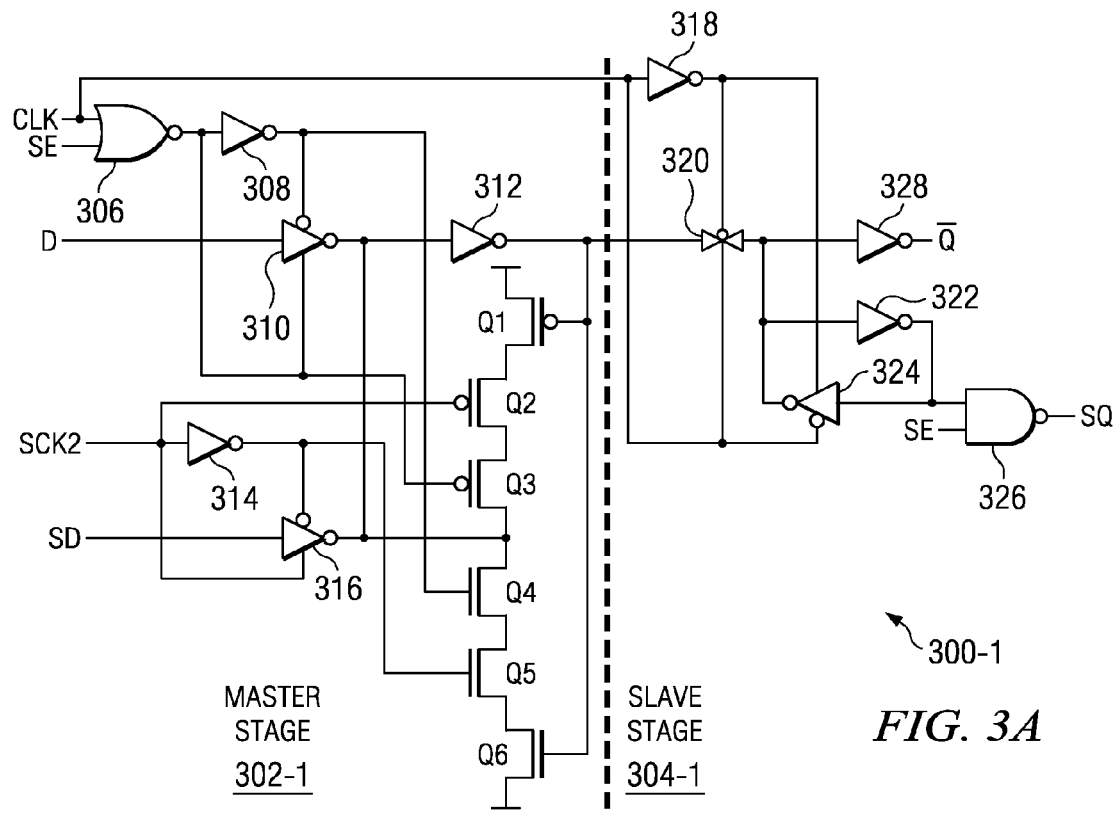

Turning to FIG. 3A, flip-flop 300-1 can be seen. The flip-flop 300-1 includes scan functionality for a scan test, as well as circuitry for operating as a positive edge triggered flip-flop in functional mode. As can be seen from flip-flop 300-1, a scan and functional multiplexer 102, as illustrated in FIG. 1 is omitted. The removal an input multiplexer, such as multiplexer 102, for scan and functional modes provides a significant improvement in operation with respect to delay and chip power consumption. The functional operations of input multiplexer 102 are incorporated into flip-flop 300-1.

In operation, NOR gate 306 is active with a scan enable signal SE to disable clocking of master latch 34. During scan mode, a scan clock SCK2 is used to clock master stage 302-1, with data provided on scan data input SD. Master clock signal CLK is used to clock slave stage 304-1 during functional or scan modes. In this arrangement, the flip-flop 300-1 is configured as back to back master and slave latches or stages 302-1 and 304-1. This arrangement permits non-overlapping master and slave scan clock operation during scan mode, and also maintains edge triggered operation during functional mode.

Clocking for the master stage 302-1 during scan mode is provided by clocking signal SCK2. Scan mode enabled clocking is also incorporated into the feedback in the master stage 302-1 with complementary CMOS transistors Q2 and Q5 (which are controlled by the scan clock SCK2 and scan clock bar $\overline{SCK2}$ that is provided by inverter 314). When the flip-flop 300-1 operates in functional mode, clock signals CLK and $\overline{CLK}$ (from NOR gate 306 and inverter 308) drive CMOS transistors Q3 and Q4 respectively, to provide master stage clocking. With this configuration, master stage 302-1 is operated with either the clock CLK in functional mode or the scan clock SCK2 in scan mode. This functionality is the same as that provided by a multiplexer (such as multiplexer 102), but avoids delays in the functional mode, reduces set-up time for the flip-flop and avoids toggled scan mode logic lines during functional mode.

Figure 2:
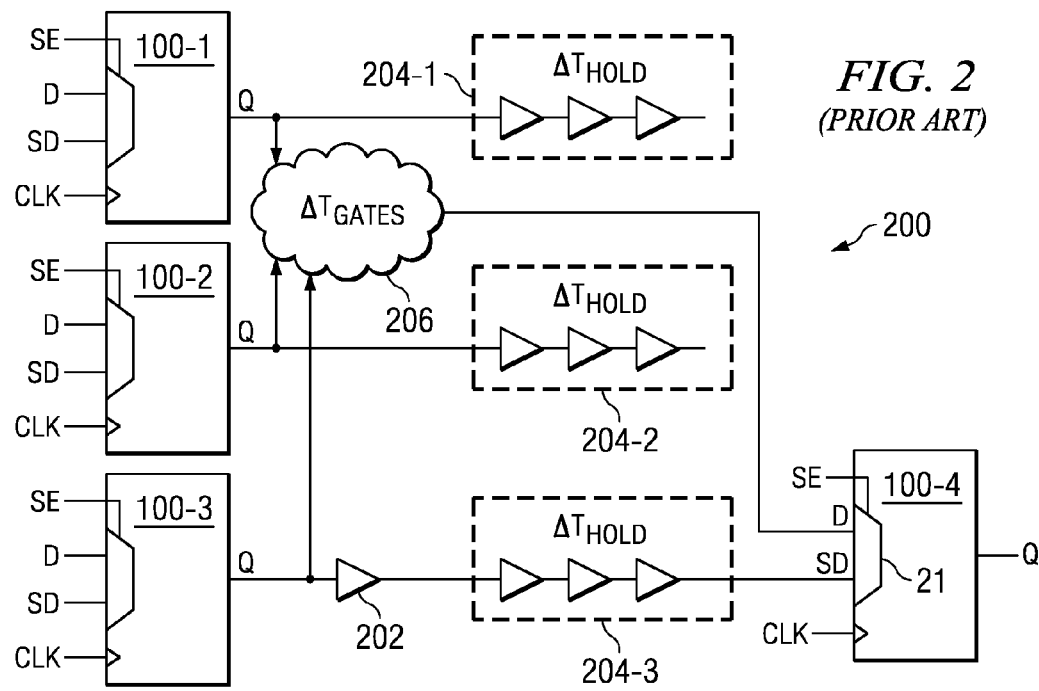
FIG. 2 is a circuit block diagram illustrating hold violation repairs and system delays.

With this configuration, delay buffers need not be inserted in the scan logic between flip-flop elements (such as can be seen in FIG. 2), thereby improving component density, reducing routing congestion, improving resistance to cross-talk interference and reducing power consumption. In addition, the elimination of scan mode hold violations with flip-flop 300-1 eliminates the scan mode hold timing closure and a number of timing corners used to validate circuit design. For example, the elimination of scan mode hold violations removes 8 timing corners from a total of 96 used to validate the final circuit design, providing an 8.3% reduction in parameter validation. The reduction in timing corners for circuit validation also leads to a reduction in iterations for design configurations that would otherwise be used to repair the scan mode hold violations. The resulting improvement in chip implementation cycle time can be significant.

One area where chip implementation cycle time is greatly improved concerns the difficulty in scan chain reordering. Scan chain reordering is typically invoked to improve routing congestion in the design of the circuit using scan mode test and verification. However, when a scan chain is reordered to reduce routing congestion, scan mode connections are typically routed through the closest available flip-flops, which represent very little delay in the scan data path. In previous scan mode implementations, the reduced delay resulting from scan chain reordering induced a large number of scan hold violations, which were typically repaired with delay buffers, adding to the implementation cycle and decreasing the efficiency of the resulting circuit. With the elimination of scan mode hold violations in accordance with the present invention, the drawbacks attendant with prior flip-flop configurations are eliminated.

Turning to the slave stage 304-1, a NAND gate 326 provides an enable gate for the scan output so that the scan output signal SQ is available during scan mode. Otherwise, in functional mode where scan logic is not enabled, scan output signal SQ is inactive due to the gating provided by NAND gate 326. The enablement of scan output signal SQ during scan mode prevents toggling of scan data path logic during functional operation, which significantly reduces power consumption of the chip incorporating flip-flop 300-1.

Figure 3B:
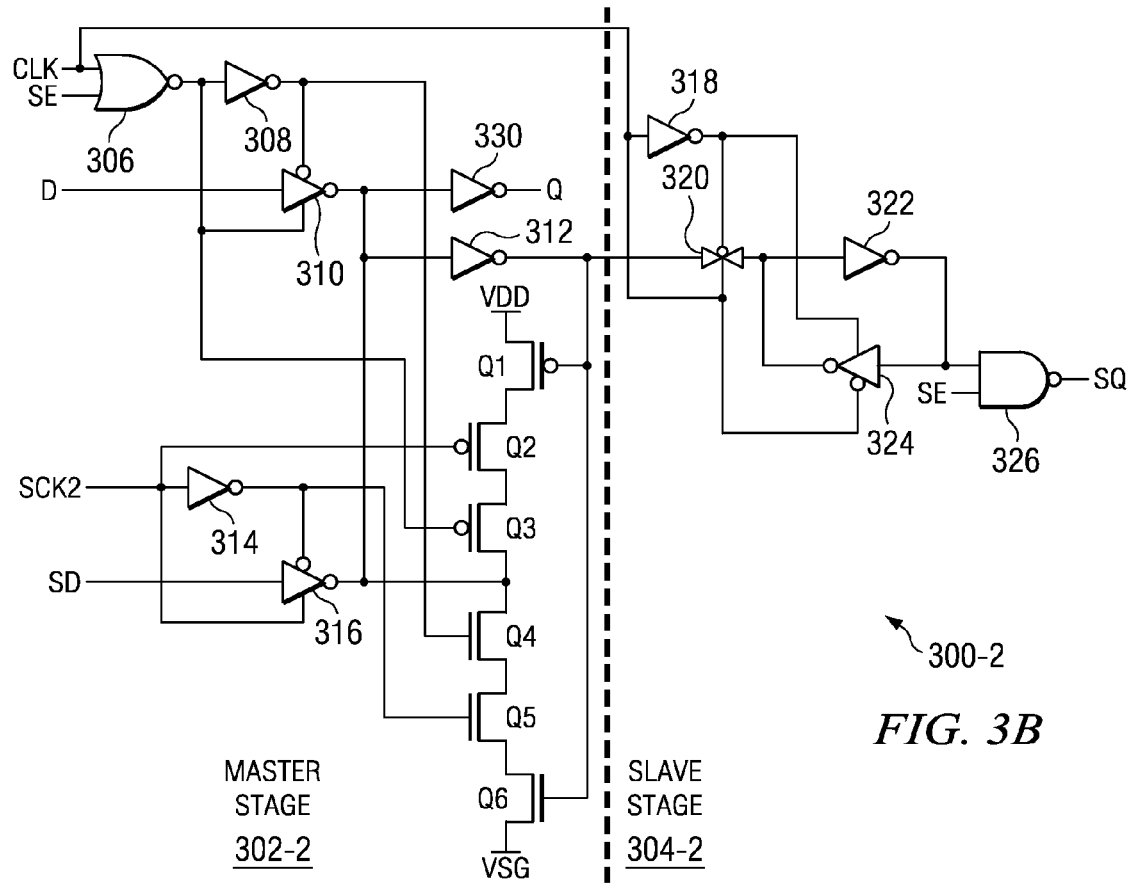

Referring now to FIG. 3B, a flip-flop architecture similar to that illustrated in FIG. 3A is shown as flip-flop 300-2. Flip-flop 300-2 is substantially similar to flip-flop 300-1, but a difference between flip-flops 300-1 and 300-2 is the replacement of inverter 328 in slave stage 304-1 with the inverter 330 of master stage 302-2. Inverter 330 in master stage 302-2 produces a non-inverted functional mode output Q instead of the inverted functional mode output $\overline{Q}$ produced by inverter 328.

Figure 3C:
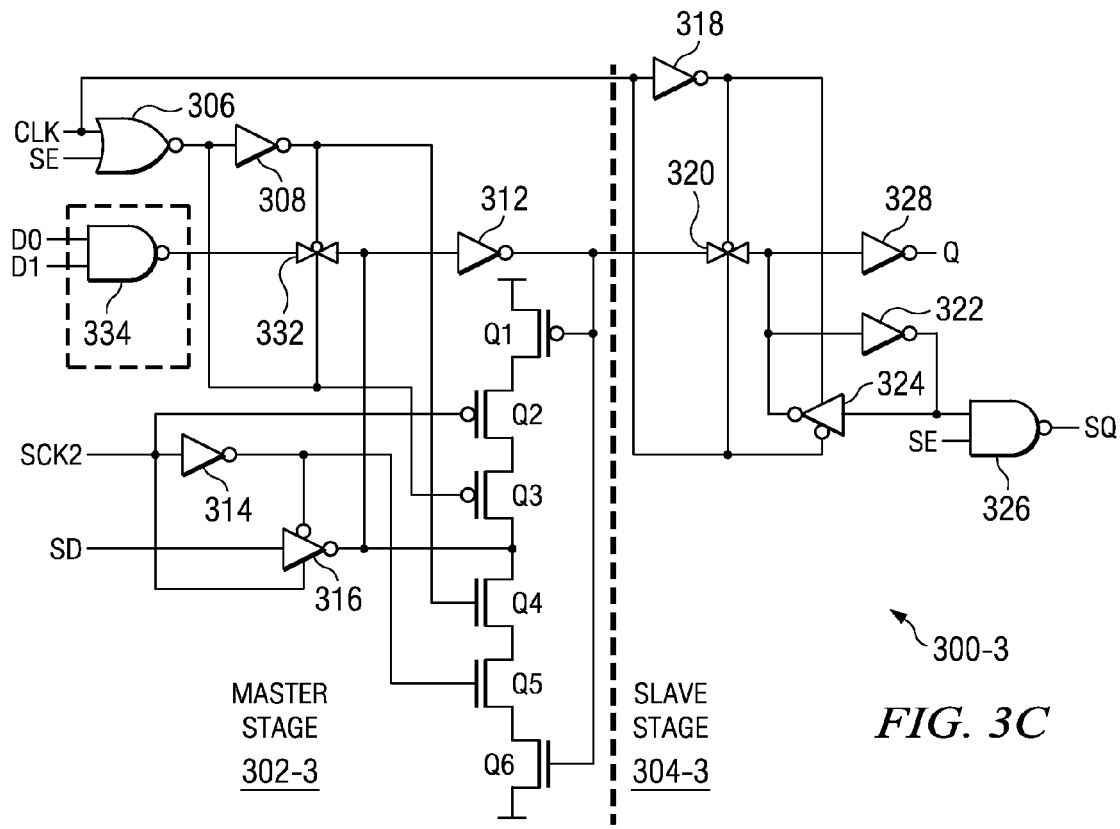

Referring now to FIG. 3C, a flip-flop architecture similar to that illustrated in FIG. 3A is shown as flip-flop 300-3. Flip-flop 300-3 is substantially similar to flip-flop 300-1, but some difference between flip-flops 300-1 and 300-3 are the replacement of tri-state inverter or buffer 310 of master stage 302-1 with the transmission gate 322 of master stage 302-3 and the additional implementation of a NAND gate 334 in master stage 302-3. The insertion of NAND gate 334 illustrates the ability of flip-flop 302-3 to absorb additional simple Boolean functions into the master stage 302-3. The additional Boolean functions are available as a direct result of integrating the scan mode multiplexer into the flip-flop 300-3. The provision of simple Boolean functions on the front end of the flip-flop 300-3 potentially permits a decrease in the number of external logic gates that may impact path delays.

Figure 3D:
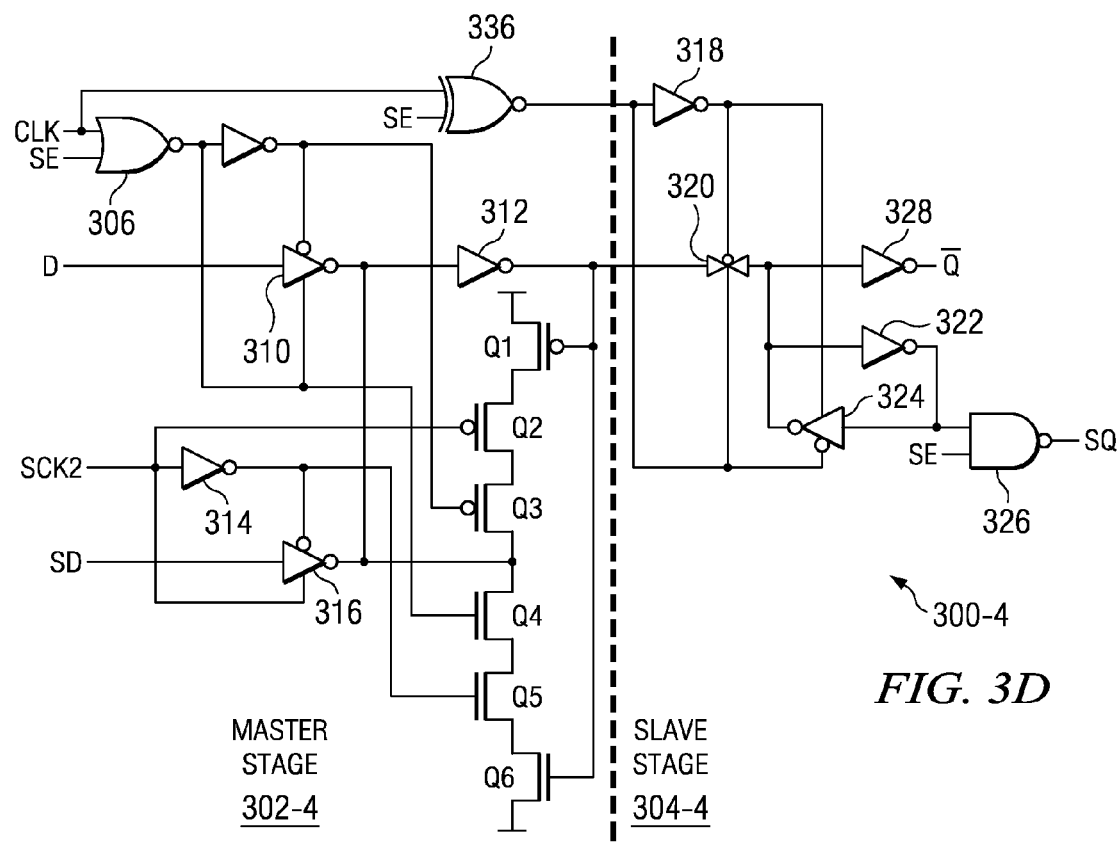

Referring now to FIG. 3D, a flip-flop architecture similar to that illustrated in FIG. 3A is shown as flip-flop 300-4. Flip-flop 300-4 is substantially similar to flip-flop 300-1, but a difference between flip-flops 300-1 and 300-4 is that flip-flop 300-4 is a negative edge triggered flip-flop with scan output gating. Negative edge triggered flip-flops, such as that illustrated in flip-flop 300-4, are somewhat uncommon in typical application designs. Accordingly, the area consumed by a negative edge flip-flop is not as important as that of a positive edge triggered flip-flop, such as flip-flop 300-1. This observation can be used to advantage in constructing a negative edge trigger flip-flop, such as flip-flop 300-4, to make the negative edge triggered flip-flop directly compatible with the positive edge triggered flip-flop functional and scan clocking methodology. That is, even though the negative edge triggered flip-flop, such as flip-flop 300-4, may not be optimally efficient, it provides a direct compatibility with positive edge triggered flip-flops, such as flip-flop 300-1, for scan mode. This compatibility avoids the need to incorporate lock-up latches on scan data inputs and outputs. A difference between the structures of flip-flops 300-1 and 300-4 is that an XNOR gate 336 is connected to inverter 318 of slave stage 304-4, and which receives clock CLK and scan enable signal SE. XNOR gate 336 is non-inverting when scan enable signal SE is active, for example a "1". During scan mode, when the clock CLK is non-inverting on the slave stage 304-4, the resulting clock signal output from XNOR gate 336 on the slave stage 304-4 is a non-overlapping slave stage scan clock. When scan mode is disabled, for example during functional mode, XNOR gate 336 is inverting, providing a negative edge flip-flop functional operation. When functional data from a positive edge flip-flop is provided to a negative edge flip-flop, a negative clock sense latch is used on the data path. When functional data from a negative edge flip-flop is sent to a positive edge flip-flop, a positive clock sense latch is used on the data path. The specifications are similar to those of conventional flip-flops, and maintain a compatibility with test equipment and conventional elements.

Figure 3E:
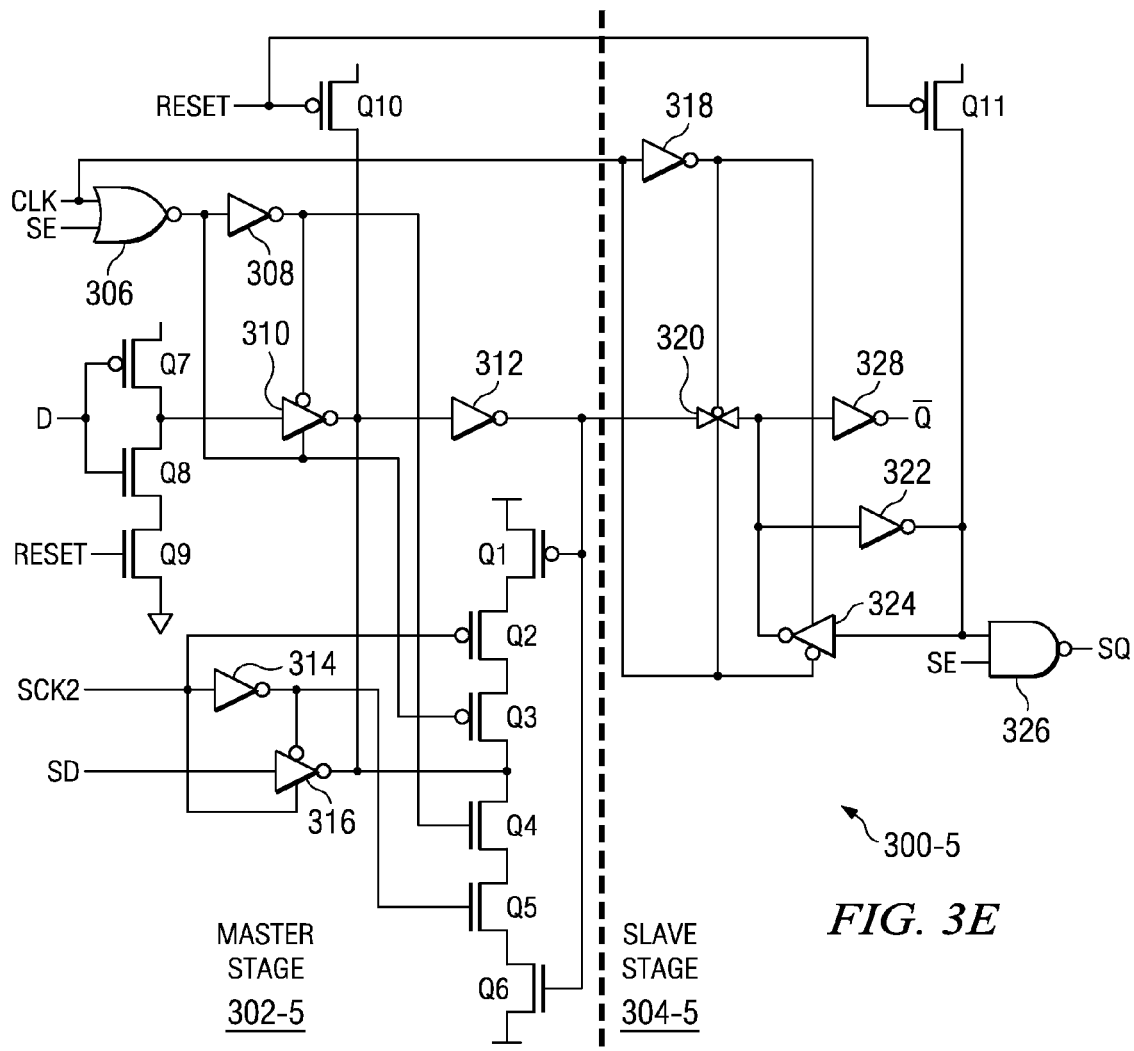
Figure 3F:
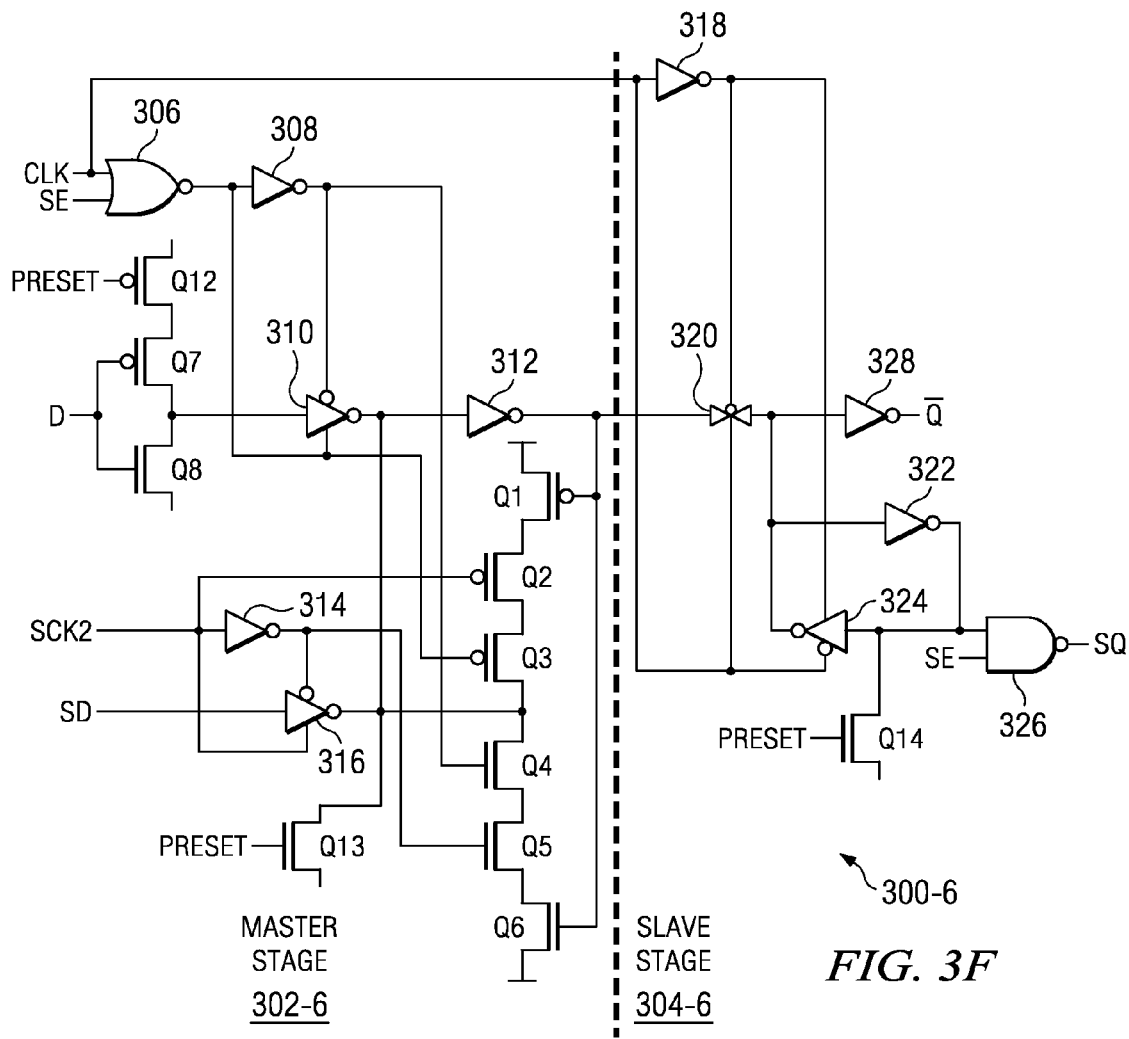

Referring now to FIGS. 3E and 3F, flip-flop architectures similar to that illustrated in FIG. 3A is shown as flip-flops 300-5 and 300-6. Flip-flops 300-5 is substantially similar to flip-flop 300-1, but a difference between flip-flops 300-1 and 300-5 is the inclusion of transistors Q7 through Q11. Flip-flops 300-6 is substantially similar to flip-flop 300-1, but a difference between flip-flops 300-1 and 300-6 is the inclusion of transistors Q7, Q8, Q12, and Q13. Flip-flops 300-5 and 300-6 are asynchronous preset and reset flip-flop configurations that are highly efficient with respect to area and power consumed. There is also very little impact on flip-flop speed with the addition of the preset or reset functionality. With respect to the reset function, the associated structure is hazard free so that recovery and removal arcs need not be characterized and modeled for parametric performance.

Figure 4:
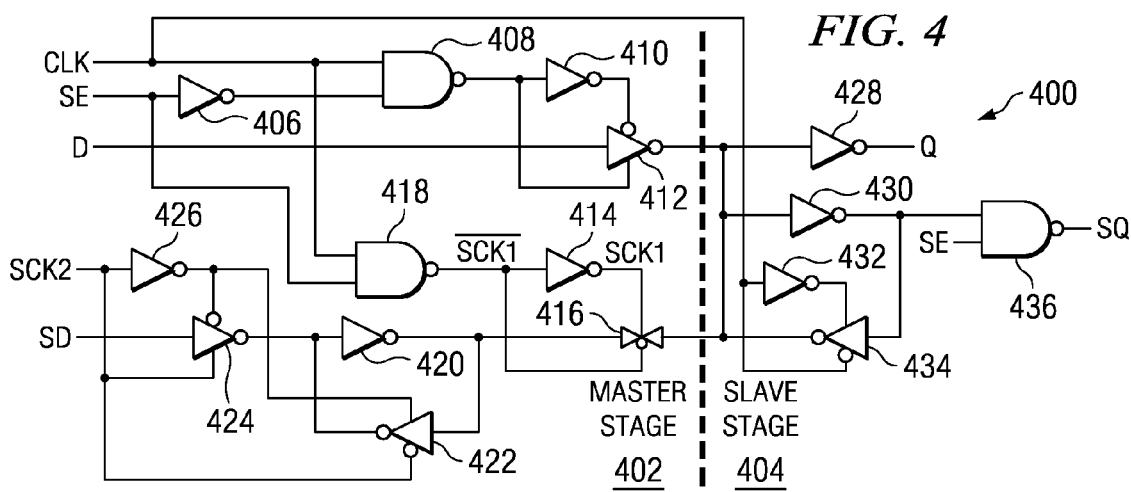
FIGS. 3A-3F and 4 are circuit block diagrams illustrating examples of flip-flops in accordance with a preferred embodiment of the present invention.

Referring now to FIG. 4, a flip-flop 400 in accordance with a preferred embodiment of the present invention is illustrated. Flip-flop 400 generally comprises a master stage 402 and a slave stage 404 that are coupled to one another. Master stage 402 generally comprises inverters 406, 426, 410, 414, and 420, NAND gates 408 and 418, tri-state inverters or buffers 424, 422, and 412, and transmission gate 416. Slave stage 404 generally comprises inverters 428, 430, and 432, tri-state buffer or inverter 434, and NAND gate 436. Flip-flop 400 provides a number of the same features as flip-flops 300-1 and 300-2, but offers a simplified feedback in the scan mode master stage to obtain additional utilization of parallel features of functional mode and the scan mode elements. In flip-flop 400, scan clock SCK2 clocks the feedback mechanism of the master stage 402, while scan clock SCK1 provides the clocking for the buffer between the master stage 402 and the slave stage 404 of the flip-flop 400.

Figure 5A:
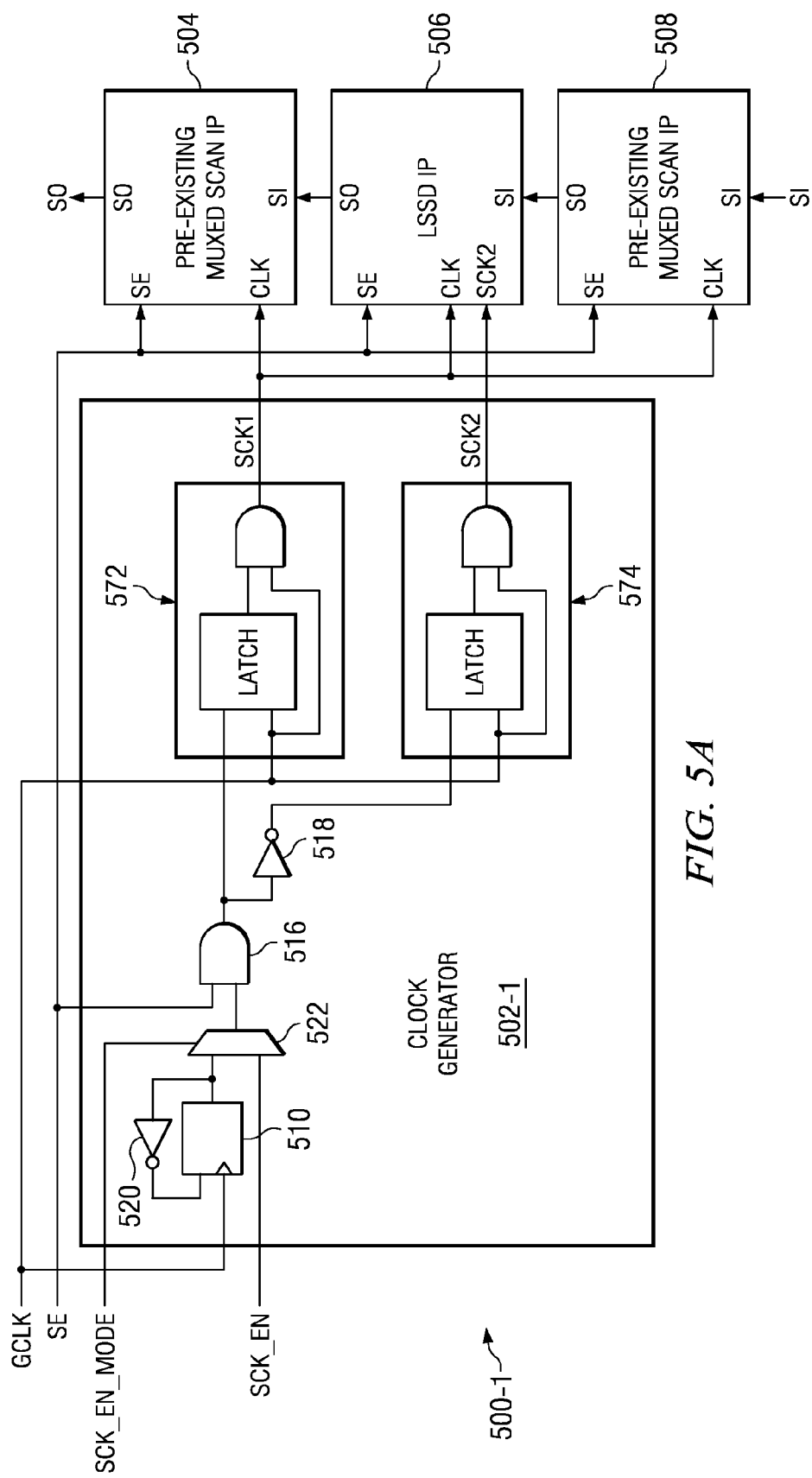
FIGS. 5A and 5B are a circuit block diagrams illustrating examples of scan clock generation circuitry in accordance with a preferred embodiment of the present invention.
Figure 5B:
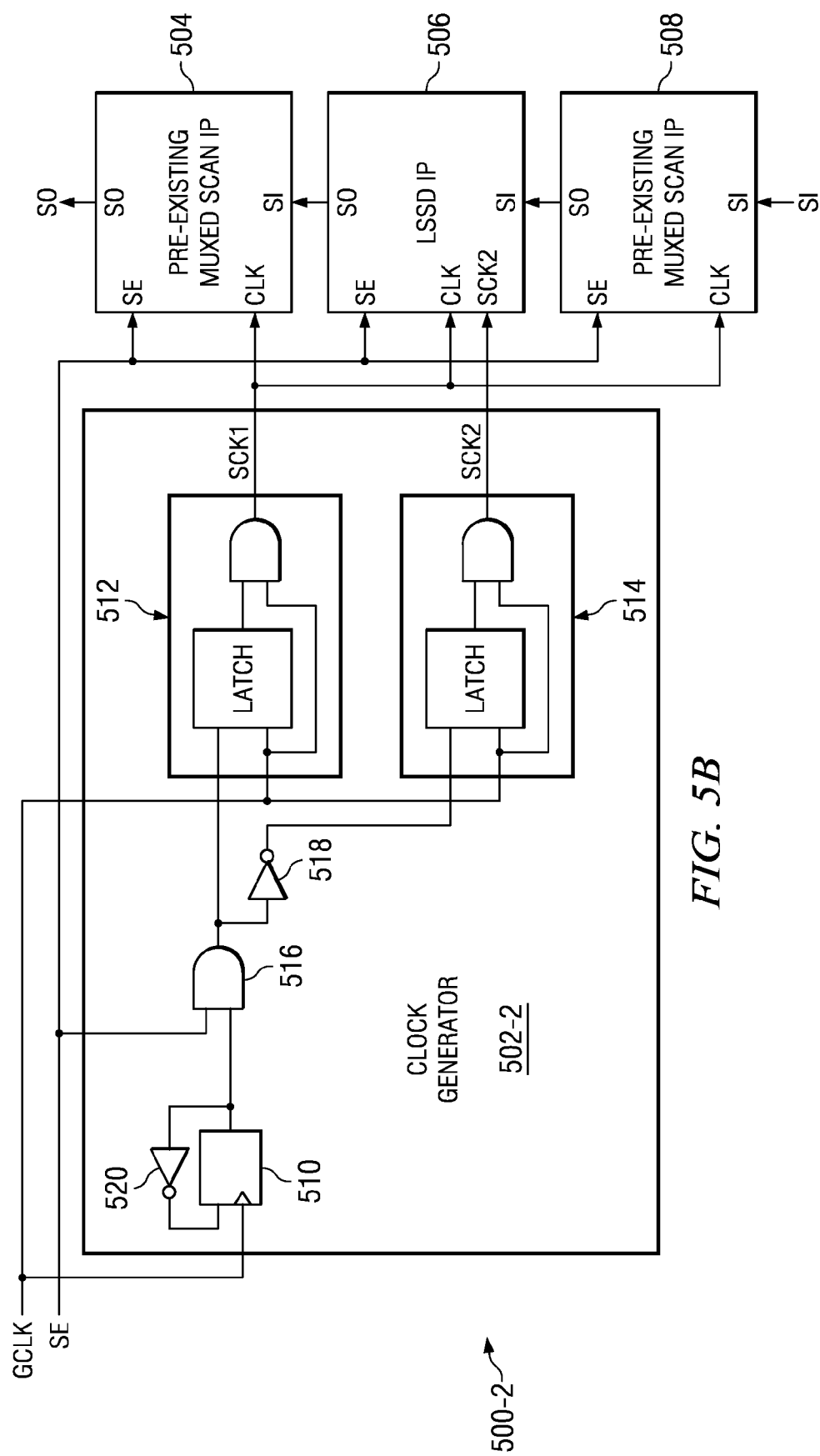
Figure 6:
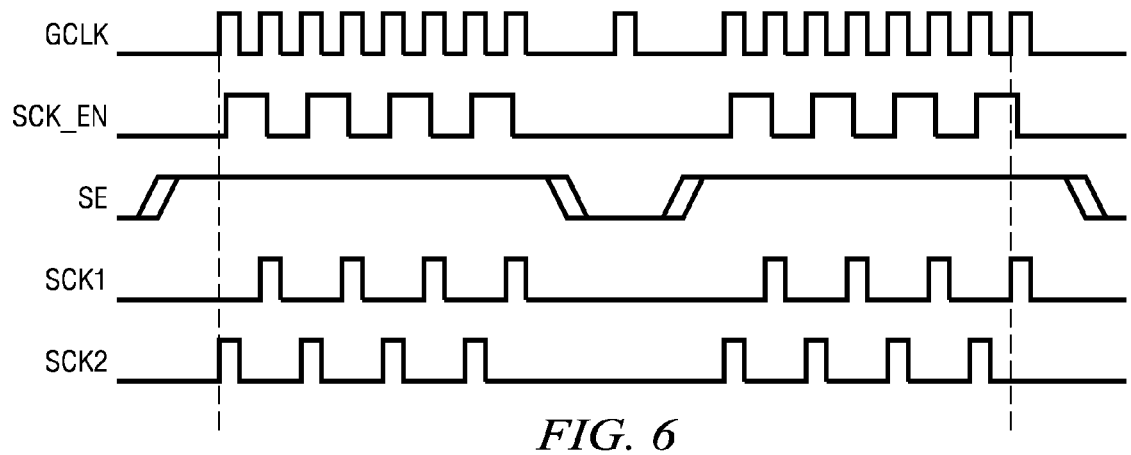
FIG. 6 is a timing diagram illustrating scan mode operation and scan clock generation of FIGS. 5A and 5B.

Referring now to FIGS. 5A and 5B, illustrations of scan clock generation in accordance with a preferred embodiment of the present invention are shown using a toggle flop 510 and inverter 520. FIG. 6 shows a timing diagram applicable to FIGS. 5A and 5B. In FIGS. 5A and 5B, diagrams 500-1 and 500-2 illustrate clocking for a chain of flip-flops 504, 506, and 508, of which flip-flops 504 and 508 are conventional flip-flops and flip-flop 506 is comprised of a flip-flop in accordance with a preferred embodiment of the present invention (such as flip-flops 300-1 to 300-6). Clock generators 502-1 and 502-2 generate a scan clock signals SCK1 and SCK2. Scan clock signal SCK1 is supplied as scan clocking for flip-flop 506, and scan clock signal SCK1 is supplied as scan clocking for pre-existing or conventional flip-flops 65 and 67 that have multiplexer inputs. The clock gating used in generators 502-1 and 502-2 may be independent of any preexisting functional clock gating in the system. Signals SCK1 and SCK2 in diagrams 500-1 and 500-2 are non-overlapping scan clocks that have a large enough spacing, or non-overlap, to eliminate all hold time violations. As illustrated in FIG. 6, the spacing between the clock pulses to prevent overlap between the scan clocks has some built in tolerance that allows for sloppy distribution of scan clock signals SCLK1 and SCLK2, or some significant amount of skew.

In diagrams 500-1 and 500-2 signal SCK1 is also used as a flip-flop clock for flip-flops 504, 506, and 508 in functional mode, and also clocks the slave stage (now shown) of flip-flop 506 in scan mode. Signal SCK2 clocks the master stage (not shown) of flip-flop 506 in scan mode. The non-overlapping master and slave scan clocks for flip-flop 506 during scan operation is the result of the provision of two separate clocks during scan mode. The architecture of flip-flop 506 permits the system to maintain edge triggered operation during functional mode when a single clock is used.

Generation of the non-overlapping master and slave scan clocks is provided by the enablement of alternating cycles of a general clock signal GCLK to generate clock signals SCK1 and SCK2. The signals used to enable the alternating cycles of the general clock signal GCLK may be obtained through a variety of methods. For example, signal SCK_EN_MODE illustrated in diagram 500-1 is used to select between two different modes. As shown, the SCK_EN_MODE operates as the select signal form multiplexer 522 so as to select between the output of toggle flop 510 and scan enable signal SCK_EN. Accordingly, a first mode provides direct test control through the selection of signal SCK_EN using multiplexer 522, and signal SCK_EN transitions on every other pulse of clock signal GCLK during scan mode, for example, as illustrated in FIG. 7.

Another method to generate the enables for the clocks is with toggle flop 510. Toggle flop 510 uses clock signal GCLK as an input to provide a reduced frequency clock signal that permits a simple enable signal for gating every other clock cycle of clock signal GCLK. The output of toggle flop 510 provides an enable that is available for selection of alternating clock cycles to generate scan clock signals SCK1 and SCK2. Toggle flop 510 changes state every other clock cycle of clock signal GCLK, to provide the alternating enables for latch circuits 512 and 514. Latch circuits 512 and 514 use the same clock signal input GCLK, and are alternately enabled by logic signals derived from toggle flop 510 or signal SCK_EN, depending which is enabled by mode selection signal SCK_EN_MODE. Accordingly, every other clock cycle of clock signal GCLK is directed to one of latch circuits 512 and 514, based on the state of the output of toggle flop 510 or signal SCK_EN. The resulting sets of non-overlapping clock signals are applied to flip-flop 506 to alternately clock the master and slave stages (not shown). The alternating clocks have no impact on flip-flops 504 and 508, since they each receive only one clock signal CLK of the two alternating available clock signals. Accordingly, the clock generation technique illustrated in diagram 500-1 acts to split the general clock signal GCLK into two separate, non-overlapping clock signals that represent alternating clock cycles of general clock signal GCLK. The conventional flip-flops 504 and 508 receive a clock signal that is essentially half the frequency of the general clock signal GCLK, with a correspondingly reduced duty cycle. That is, the apparent duty cycle of the clocks applied to conventional flip-flops 504 and 508 is approximately 25% as compared to the general clock signal GCLK that has an apparent duty cycle of approximately 50%. The relationship of the various clock signals and signal SCK_EN is illustrated in FIG. 6.

Alternatively, as can be seen with generator 502-2, toggle flop 510 changes state every other clock cycle to provide and enable for latch circuits 512 and 514 that change with every other cycle of general clock signal GCLK. Accordingly, flip-flop 506 receives two non-overlapping clock signals to clock scan data from input SI to output SO. Flip-flops 504 and 508 receive a single clock signal to shift scan data from input SI to output SO. As discussed above, the clock signal provided to flip-flop 504 and 508 represents a frequency that is half of that of general clock signal GCLK and has an apparent duty cycle of approximately 25%. In diagram 500-2, the output of toggle flop 510 is substantially similar to the waveform of signal SCK_EN, illustrated in FIG. 6. Accordingly, the output of toggle flop 510 changes state with each clock cycle, producing an enable signal with a frequency of approximately half that of general clock signal GCLK, and with approximately a 50% duty cycle.

An advantage provided by the clock generation architecture illustrated in diagrams 500-1 and 500-2 is the control of the scan clock separation through control of the input clock period and duty cycle. The scan mode tester can be adjusted to optimize the clock period and duty cycle during scan mode to increase the scan mode clock frequency. That is, with reduced clock duty cycle the clock high time can be reduced to further increase clock frequency during scan mode. According to the clocking architecture, the frequency of general clock signal GCLK is twice the frequency used for clocking during scan mode.

Figure 7B:
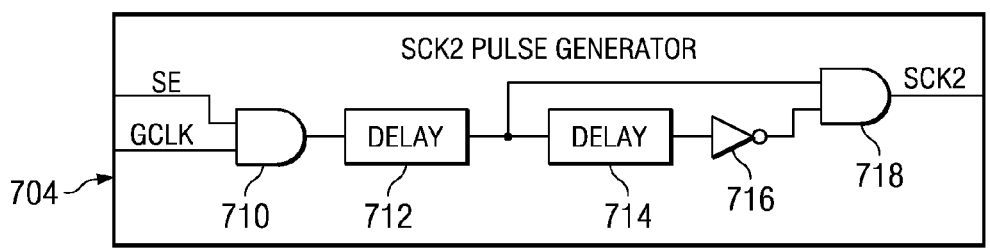
FIGS. 7A and 7B are a circuit block diagrams illustrating examples of scan clock generation circuitry in accordance with a preferred embodiment of the present invention.
Figure 7A:
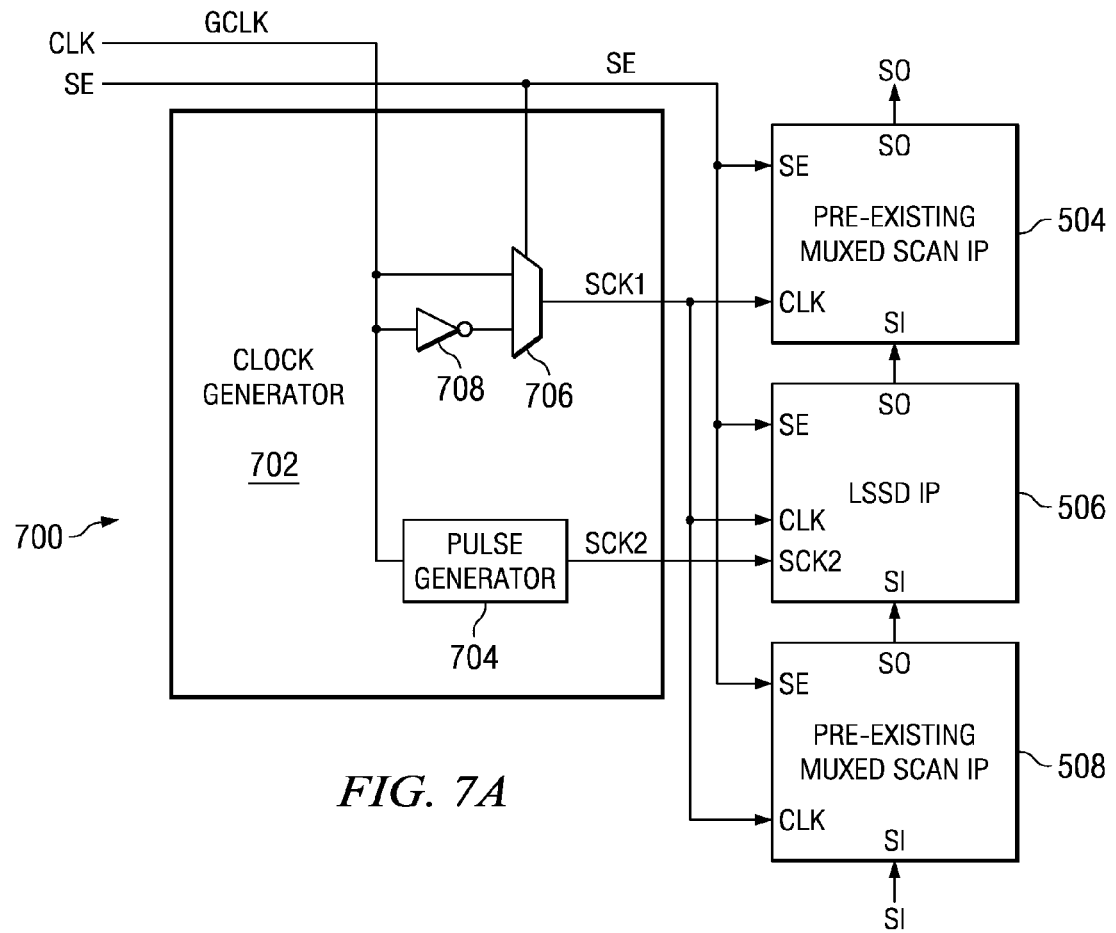
Figure 8:
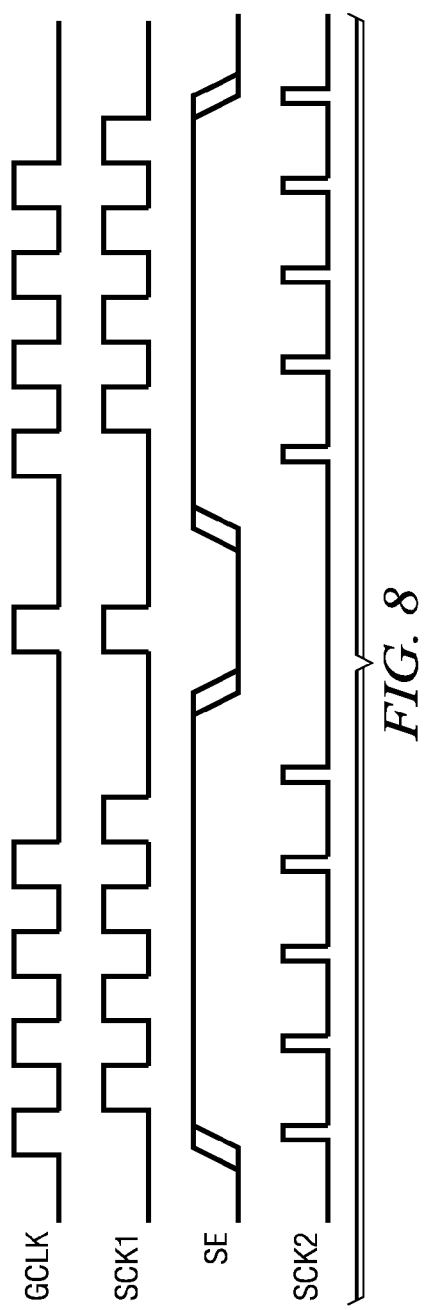
FIG. 8 is a timing diagram illustrating scan mode operation and scan clock generation of FIGS. 7A and 7B.

Referring now to FIG. 7A, a scan clock generator in accordance with a preferred embodiment of the present invention is illustrated as diagram 700. In diagram 700, clock generator block 702 illustrates how scan mode clock frequency for clock signals SCK2 may be improved with the use of a small, power efficient, pulse generator. Diagram 700 illustrates the generation of scan clock signal SCK2 using a rising edge of an input clock signal GCLK. A pulse generator 704 produces scan clock signal SCK2 based on the rising edge of clock signal GCLK. Scan clock signal SCK1 is simply the inverted signal of clock signal GCLK (generated by inverter 708) to provide scan mode slave stage clocking. The gating of the signal to scan clock signal SCK1 is controlled through a multiplexer 706, controlled with scan enable signal SE. Since clock signal SCK2 is generated from the rising edge of clock signal GCLK, and clock signal SCK1 is the inversion of clock signal GCLK, clock signals SCK1 and SCK2 are formed as synchronized non-overlapping scan clock signals. The relationship of the scan clock signals applied to flip-flops 504, 506, and 508 are illustrated in the timing diagram of FIG. 8. In FIG. 8, clock signal SCK2 is illustrated as short pulses determined from the rising edge of clock signal GCLK which are active while the scan enable signal SE is active. Clock signal SCK1 is the inverse of clock signal GCLK, while scan enable signal SE is active. Clock signal SCK1 is substantially identical to clock signal GCLK when scan enable signal SE is inactive. According to this configuration, during scan mode, the master stage of flip-flop 506 is operated with a short pulse signal from clock signal SCK2 during scan mode, while conventional flip-flops 504 and 508, and the slave stage of flip-flop 506 are operated with the longer pulse clock signal SCK1. Pulse generator 704 may be constructed very simply because the duty cycle and edge positioning of scan clock SCK2 with respect to SCK1 is non-critical.

Referring now to FIG. 7B, a illustration of an example of a pulse generator 704. Pulse generator 704, which is used to produce clock signal SCK2, has two inputs that each receive one of scan enable signal SE and clock signal GCLK. As shown in FIG. 7B, pulse generator 704 is generally comprised of an AND gates 710 and 718, delays 712 and 714, and inverter 716. Alternatively, pulse generator 704 may be a simplified to not use scan enable signal SE as an input. Pulse generator 704 operates off of the rising edge of clock signal GCKL to produce an upward transition on clock signal SCK2 after delay 712. Clock signal SCK2, the output of AND gate 718, transitions high with a high transition on clock signal GCLK, since both inputs are temporarily active or high. Once the rising edge signal of clock signal GCLK propagates through delay 714 and inverter 716, the output of AND gate 718 turns off, leading to a downward transition for clock signal SCK2. Using this simple pulse generator 704, the delay between the rising edge of clock signal GCLK and the rising edge of clock signal SCK2 can be set using delay 712, while the pulse width of clock signal of SCK2 can be set using delay 714.

Turning back to FIG. 7A, an advantage to providing scan clock signal SCK2 as short pulses determined by rising edges of clock signal GCLK is that the clock frequency applied to flip-flops 504, 506, and 508 during scan mode is the same frequency at which flip-flops 504, 506, and 508 are clocked. Accordingly, there is no reduction in scan mode clock frequency as is the case in the previous embodiment, where each of the scan clocks SCK1 and SCK2 operate at half the frequency of the applied general clock signal GCLK.

Another technique for generating scan clocks SCK1 and SCK2 is through the use of a reference clock, synchronized to an input clock through an event. The reference clock may be generated on-chip using a phase-locked loop (PLL). The PLL may be synchronized with the reference clock to be independent of clock signal GCLK. Alternately, or in addition, the reference clock may be provided externally during testing or during a scan enable mode. Such a reference clock could always be oscillating, and need not be synchronous with clock signal GCLK. That is, in the example of the PLL generated reference clock, the reference clock pulses can be asynchronous to the input scan clock and may be four to eight, or more, times faster than the input or test clock frequency. Preferably, the reference clock is at least 4 times faster than the input or test clock frequency. A higher frequency PLL output domain can be synchronized with either edge of an input or test clock signal. With this synchronization, a high frequency clock signal can be provided to scan clock SCK2 followed by a small delay and the output of another high frequency signal to scan clock SCK1. The delay can be provided by gating off PLL clock cycles between the provisions of clock pulses on scan clocks SCK2 and SCK1. This configuration provides non-overlapping scan clock signals SCK1 and SCK2 with small duty cycles and high frequency. As discussed above, these non-overlapping scan mode clock signals would be compatible with pre-existing multiplexer based scan mode flip-flops.

Referring now to FIG. 9A, a scan clock generator in accordance with a preferred embodiment of the present invention is illustrated as diagram 900. Circuit 900 illustrates the generation of scan clock signals SCK1 and SCK2 as short pulses based on rising edges of clock signal GCLK. Pulse generators 902 and 904 are used to generate pulses for scan clock signals SCK1 and SCK2 respectively. Pulse generators 902 is generally comprised of AND gates 906-1 and 910-1, delay 908-1, and inverter 912-1, and pulse generators 904 is generally comprised of AND gates 906-2 and 910-2, delay 908-2, and inverter 912-2. A difference between generators 902 and 904 is the position of inverters 912-1 and 912-2. In generator 902, inverter 912-1 is connected between AND gates 906-1 and 910-1, and in generator 904, inverter 912-2 is connected between delay 908-2 and AND gate 910-2. Generators 902 and 904 operate similarly to the pulse generator 704, except that generator 902 produces a short pulse when clock signal GCLK transitions from a high to a low state, while generator 904 produces a short pulse when clock signal GCLK transitions from low to high states. The length of the pulses produced by either of generators 902 and 904 can be controlled through manipulation of delay elements 908, respectively. Through the use of pulse generators 902 and 904, non-overlapping scan clock signals SCK1 and ACK2 can be generated for flip-flop 506. Because signals SCK1 and SCK2 are generated from the falling edge and rising edge of clock signal GCLK, respectively, the scan clock signals provide clock timing on flip-flop 506 that is the same frequency as clock signal GCLK. That is, two scan clock pulses are generated for every pulse of clock signal GCLK, which permits flip-flop 506 to be clocked at the same frequency as conventional flip-flops 504 and 508. During functional mode, generator 914 (which is generally comprised of NAND gates 916, 918, and 920 and inverter 922) selects clock signal GCLK to be applied to the usual clock input of flip-flop 506. That is, when scan enable signal SE is low, clock signal GCLK is enabled to the output of generator 914 as functional clock signal MCLK1, which is input to the clock input of flip-flop 506. When scan enable signal SE is high, clock signal SCK1 is enabled to the output of generator 914 to form scan clock signal MCLK1 that is applied to the clock input of flip-flop 506. Accordingly, pulse generators 902 and 904 are non-active during functional mode to reduce power consumption of the resulting clock generation circuitry.

Figure 9B:
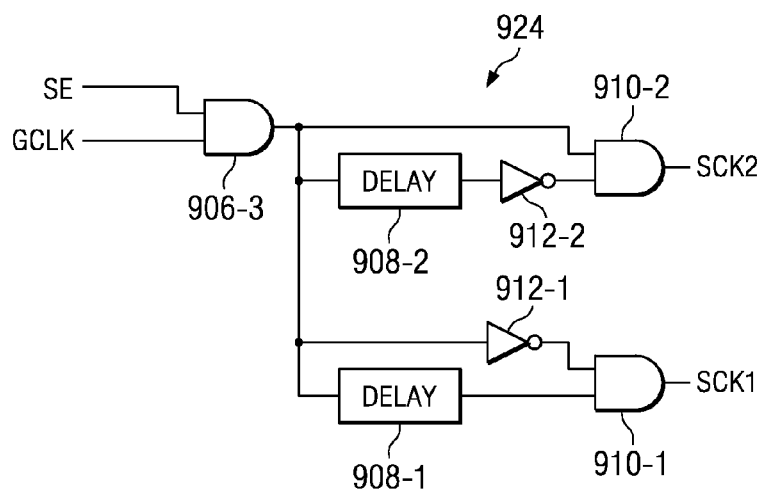

Referring to FIG. 9B, a pulse generator to form clock signals SCK1 and SCK2 is illustrated as block 924. Generator 924 represents pulse generation blocks 902 and 904 formed in a consolidated circuit, where AND gate 906-3 has replaced AND gates 906-1 and 906-2.

Figure 10:
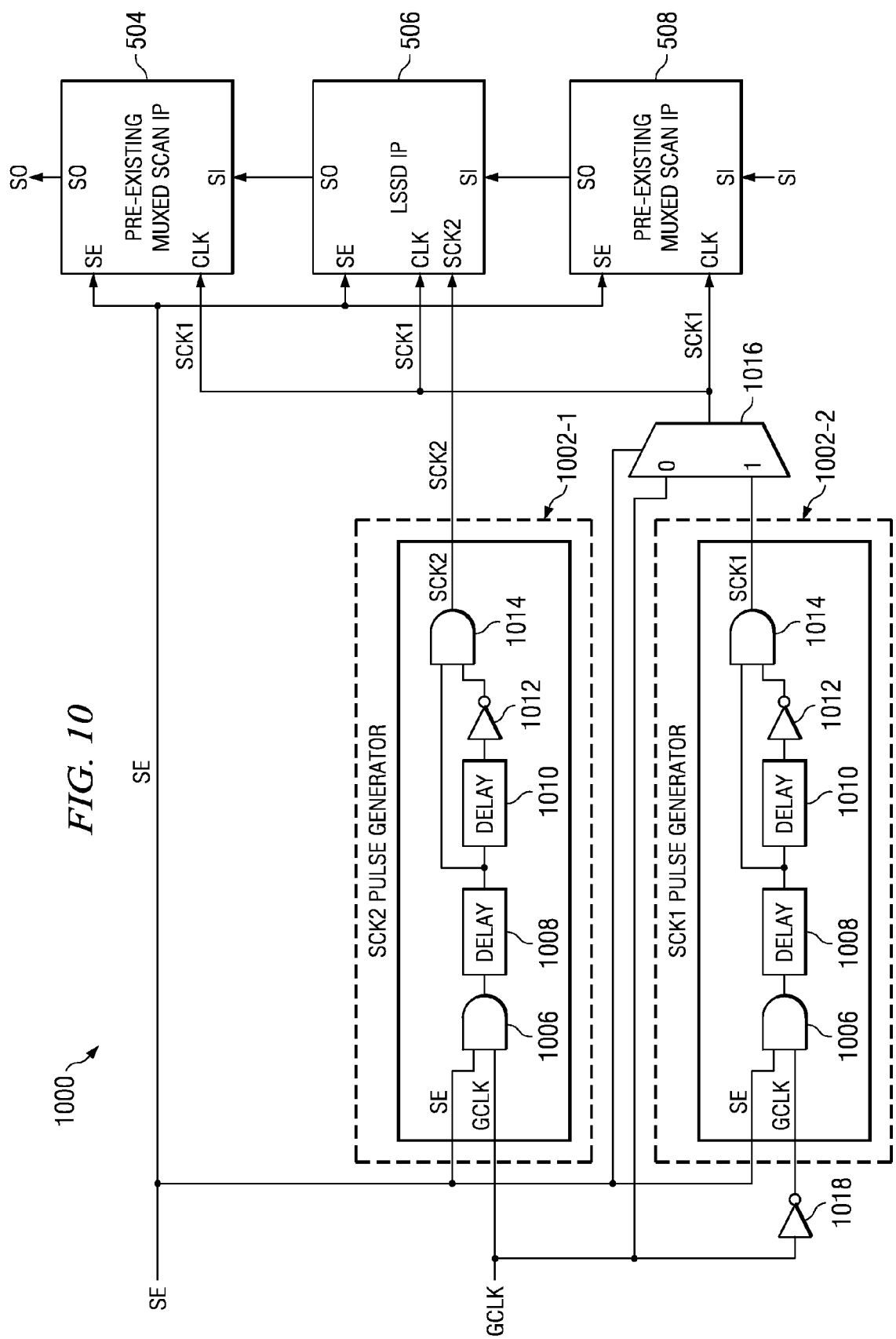
FIG. 10 is a circuit block diagram for scan clock generation according to another embodiment of the present invention.

Referring now to FIG. 10, a scan clocks generator in accordance with a preferred embodiment of the present invention is illustrated generally as diagram 1000. Pulse generators 1002-1 and 1002-1 provide the scan clock signals SCK1 and SCK2 and are each generally comprised of AND gates 1006 and 1014, delays 1008 and 1010, and inverter 1012. Additionally, generator 1002-1 receives the signal GCLK, while generator 1002-2 receives the inverse of the GCLK signal from inverter 1018. The scan clock generator 1000 has the advantage of reusing the same pulse generators 704 to permit a potential reduction in the number of different components used to form the overall circuit that includes flip-flops 504, 506, and 508. AND gates 1006 act as enable circuits to gate clock signal GCLK to a low state when scan enable signal SE is inactive. With the output of AND gates 1006 tied low when signal SE is inactive, scan clock signal SCK2 is low, or inactive, to permit functional mode clocking for flip-flops 506, 508, and 510. Accordingly, scan clock signal SCK2 is low or inactive during functional mode. During functional mode, scan enable signal SE is inactive, and selects clock signal GCLK to pass through a multiplexer 1014. Clock signal SCK1 becomes the same as clock signal GCLK, and scan clock signal SCK2 is inactive. Flip-flop 506, thus, uses functional mode clock signal GCLK to drive the master stage storage node in functional mode.

Figure 11:
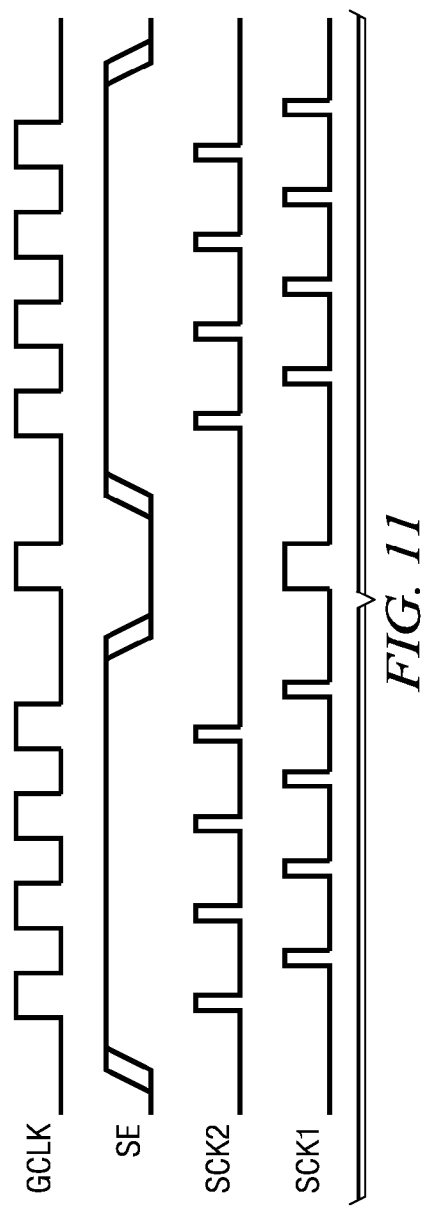
FIG. 11 is a timing diagram illustrating scan mode operation and scan clock generation in accordance with another embodiment of the present invention.

Referring to FIG. 11, an illustration of the arrangement of scan clocks SCK1 and SCK2 from generator 1000 is illustrated in a timing diagram. The rising edges of the pulses in scan clocks SCK1 and SCK2 are aligned with the falling and rising edges of clock signal GCLK, respectively. Scan clocks SCK1 and SCK2 are active when the scan enable signal SE is high, or scan mode is enabled. By generating scan clock signals SCK1 and SCK2 as short pulses to provide non-overlapping scan clock signals, the apparent transfer rate of information through a flip-flop according to the present invention is the same as conventional flip-flops, since two scan clock pulses are generated for every clock cycle of the input clock cycle GCLK.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

What is claimed is:

1. An apparatus comprising:
a master stage that is adapted to receive a clock signal, a data signal, a enable signal, a scan data signal, and a scan clock signal, wherein the master stage includes:
clock input logic including:
a NOR gate that receives the enable signal and the clock signal; and
an clock inverter that is coupled to the NOR gate;
a first multi-state circuit that receives the data signal and that is coupled to the clock input circuit, wherein the clock input circuit controls the first multi-state circuit;
scan clock input logic that receives the scan clock signal wherein the scan clock input logic includes a scan clock inverter;
a second multi-state circuit that receives the scan data signal and that is coupled to the clock input logic, wherein the scan clock input logic controls the second multi-state circuit; and
a control circuit that is coupled to the first and second multi-state circuits, wherein the control circuit includes a plurality of transistors coupled in series with one another, wherein the control electrode of each transistor is coupled to at least one of the input terminal of the scan clock inverter, the output terminal of the scan clock inverter, the input terminal of the clock inverter, the output terminal of the clock inverter, and the input circuit, and wherein the second multi-state circuit is coupled to a node between at least two of the transistors; and
a slave stage including:
input circuit that is coupled to the control circuit and that receives the clock signal;
output logic that is coupled to input circuit and that provides a scan mode output.

2. The apparatus of claim 1, wherein the second multi-state circuit further comprises a tri-state inverter.

3. The apparatus of claim 1, wherein the input circuit further comprises:
an input inverter that receives the clock signal;
a transmission gate that is coupled to the input inverter and to the control circuit, wherein the input inverter controls the transmission gate;
an transmission inverter coupled to the transmission gate; and
a tri-state inverter that is coupled in parallel to the transmission inverter and that is coupled to the input inverter, wherein the input inverter controls the tri-state inverter.

4. The apparatus of claim 3, wherein the first multi-state circuit further comprises:
a second tri-state inverter that receives the data signal and that is coupled to the NOR gate and the clock inverter; and
an intermediate inverter that is coupled between the second tri-state inverter and the control circuit.

5. The apparatus of claim 4, wherein the output logic further comprises:
an output inverter that is coupled to the transmission gate; and
an NAND gate that is coupled to the transmission inverter and that receives the enable signal.

6. The apparatus of claim 4, wherein the first multi-state circuit further comprises an output inverter that is coupled to the second tri-state inverter.

7. The apparatus of claim 4, wherein the master stage further comprises a XNOR gate that receives the clock signal and the enable signal and that is coupled to the input inverter.

8. The apparatus of claim 3, wherein the data signal further comprises a plurality of data signals, and wherein the first multi-state circuit further comprises:
a NAND gate that receives the plurality of data signals;
a second transmission gate that is coupled to the NAND gate, the NOR gate, and the clock inverter; and
an intermediate inverter that is coupled to the transmission gate.

9. An apparatus comprising:
a master stage that is adapted to receive a clock signal, a data signal, a enable signal, a scan data signal, and a scan clock signal, wherein the master stage includes:
clock input logic that receives the enable signal and the clock signal;
a first multi-state circuit that receives the data signal and that is coupled to the clock input circuit, wherein the clock input circuit controls the first multi-state circuit;
scan clock input logic that receives the scan clock signal, wherein the scan clock input logic includes a scan clock inverter;
a second multi-state circuit that receives the scan data signal and that is coupled to the clock input logic, wherein the scan clock input logic controls the second multi-state circuit, wherein the second multi-state circuit includes:
a first tri-state inverter that receives the scan data signal and that is coupled to the scan clock inverter;

an scan data inverter that is coupled to the first tri-state inverter; and
a second tri-state inverter that is coupled in parallel to the scan data inverter; and
a control circuit that is coupled to the first and second multi-state circuits; and
a slave stage including:
input circuit that is coupled to the control circuit and that receives the clock signal;
output logic that is coupled to input circuit and that provides a scan mode output.

10. The apparatus of claim 9, wherein the control circuit further comprises:
a NAND gate that receives the clock signal and the enable signal;
a control inverter that is coupled to the NAND gate;
a transmission gate that is coupled to the NAND gate, the control inverter, the scan data inverter, and the input circuit.

11. An apparatus comprising:
a master stage that is adapted to receive a clock signal, a data signal, a enable signal, a scan data signal, and a scan clock signal, wherein the master stage includes:
a NOR gate that receives the enable signal and the clock signal;
a first inverter that is coupled to the NOR gate;
a first tri-state inverter that receives the data signal and that is coupled to the NOR gate and the first inverter;
a second inverter that is coupled to the first tri-state inverter;
a third inverter that receives the scan clock signal;
a second tri-state inverter that that receives the scan data signal and that is coupled to the NOR gate and the first inverter;
a first PMOS transistor, wherein the gate of the first PMOS transistor is coupled to the second inverter;
a second PMOS transistor that is coupled in series with the first PMOS transistor, wherein the gate of the second PMOS transistor receives the scan clock signal;
a third PMOS transistor that is coupled in series with the second PMOS transistor, wherein the gate of the third PMOS transistor is coupled to the NOR gate;
a first NMOS transistor that is coupled in series with the third PMOS transistor, wherein the gate of the first NMOS transistor is coupled to the first inverter;
a second NMOS transistor that is coupled in series with the first NMOS transistor, wherein the gate of the second NMOS transistor is coupled to the third inverter; and
a third NMOS transistor that is coupled in series with the second NMOS transistor, wherein the gate of the third NMOS transistor is coupled to the second inverter; and
a slave stage including:
input circuit that is coupled to the second inverter;
output logic that is coupled to input circuit and that provides a scan mode output.

12. The apparatus of claim 11, wherein the input circuit further comprises:
a fourth inverter that receives the clock signal;
a transmission gate that is coupled to the fourth inverter and to the third inverter;
a fifth inverter coupled to the transmission gate; and
a third tri-state inverter that is coupled in parallel to the transmission inverter and that is coupled to the input inverter.

13. The apparatus of claim 12, wherein the output logic further comprises:
a sixth inverter that is coupled to the transmission gate; and
an NAND gate that is coupled to the fifth inverter and that receives the enable signal.

14. The apparatus of claim 12, wherein the master stage further comprises a sixth inverter that is coupled to the first tri-state inverter.

15. An apparatus comprising:
a master stage that is adapted to receive a clock signal, a plurality of data signals, a enable signal, a scan data signal, and a scan clock signal, wherein the master stage includes:
a NOR gate that receives the enable signal and the clock signal;
a first inverter that is coupled to the NOR gate;
an NAND gate that receives the plurality of data signals;
a transmission gate that is coupled to the NOR gate, the first inverter, and the NAND gate;
a second inverter that is coupled to the transmission gate;
a third inverter that receives the scan clock signal;
a tri-state inverter that that receives the scan data signal and that is coupled to the NOR gate and the first inverter;
a first PMOS transistor, wherein the gate of the first PMOS transistor is coupled to the second inverter;
a second PMOS transistor that is coupled in series with the first PMOS transistor, wherein the gate of the second PMOS transistor receives the scan clock signal;
a third PMOS transistor that is coupled in series with the second PMOS transistor, wherein the gate of the third PMOS transistor is coupled to the NOR gate;
a first NMOS transistor that is coupled in series with the third PMOS transistor, wherein the gate of the first NMOS transistor is coupled to the first inverter;
a second NMOS transistor that is coupled in series with the first NMOS transistor, wherein the gate of the second NMOS transistor is coupled to the third inverter; and
a third NMOS transistor that is coupled in series with the second NMOS transistor, wherein the gate of the third NMOS transistor is coupled to the second inverter; and
a slave stage including:
input circuit that is coupled to the second inverter;
output logic that is coupled to input circuit and that provides a scan mode output.

16. The apparatus of claim 15, wherein the input circuit further comprises:
a fourth inverter that receives the clock signal;
a second transmission gate that is coupled to the fourth inverter and to the third inverter;
a fifth inverter coupled to the second transmission gate; and
a second tri-state inverter that is coupled in parallel to the transmission inverter and that is coupled to the input inverter.

17. The apparatus of claim 15, wherein the output logic further comprises:
a sixth inverter that is coupled to the transmission gate; and
an NAND gate that is coupled to the fifth inverter and that receives the enable signal.

18. An apparatus comprising:
a master stage that is adapted to receive a clock signal, a data signal, a enable signal, a scan data signal, and a scan clock signal, wherein the master stage includes:

a NOR gate that receives the enable signal and the clock signal;
a first inverter that is coupled to the NOR gate;
a first tri-state inverter that receives the data signal and that is coupled to the NOR gate and the first inverter;
a second inverter that is coupled to the first tri-state inverter;
a third inverter that receives the scan clock signal;
a second tri-state inverter that that receives the scan data signal and that is coupled to the NOR gate and the first inverter;
a XNOR gate that receives the clock signal and the enable signal;
a first PMOS transistor, wherein the gate of the first PMOS transistor is coupled to the second inverter;
a second PMOS transistor that is coupled in series with the first PMOS transistor, wherein the gate of the second PMOS transistor receives the scan clock signal;
a third PMOS transistor that is coupled in series with the second PMOS transistor, wherein the gate of the third PMOS transistor is coupled to the NOR gate;
a first NMOS transistor that is coupled in series with the third PMOS transistor, wherein the gate of the first NMOS transistor is coupled to the first inverter;
a second NMOS transistor that is coupled in series with the first NMOS transistor, wherein the gate of the second NMOS transistor is coupled to the third inverter; and
a third NMOS transistor that is coupled in series with the second NMOS transistor, wherein the gate of the third NMOS transistor is coupled to the second inverter; and
a slave stage including:
input circuit that is coupled to the second inverter and to the XNOR gate;
output logic that is coupled to input circuit and that provides a scan mode output.

19. The apparatus of claim 18, wherein the input circuit further comprises:
a fourth inverter that is coupled to the XNOR gate;
a transmission gate that is coupled to the fourth inverter and to the third inverter;
a fifth inverter coupled to the transmission gate; and
a third tri-state inverter that is coupled in parallel to the transmission inverter and that is coupled to the input inverter.

20. The apparatus of claim 18, wherein the output logic further comprises:
a sixth inverter that is coupled to the transmission gate; and
an NAND gate that is coupled to the fifth inverter and that receives the enable signal.

21. An apparatus comprising:
a master stage that is adapted to receive a clock signal, a data signal, a enable signal, a scan data signal, and a scan clock signal, wherein the master stage includes:
a NOR gate that receives the enable signal and the clock signal;
a first inverter that is coupled to the NOR gate;
a first PMOS transistor that receives the data signal at its gate;
a first NMOS transistor that is coupled in series to the first PMOS transistor and that receives the data signal at its gate;
a first tri-state inverter that coupled to the NOR gate, the first inverter, the first NMOS transistor, and the first PMOS transistor;
a second inverter that is coupled to the first tri-state inverter;
a third inverter that receives the scan clock signal;
a second tri-state inverter that that receives the scan data signal and that is coupled to the NOR gate and the first inverter;
a second PMOS transistor, wherein the gate of the second PMOS transistor is coupled to the second inverter;
a third PMOS transistor that is coupled in series with the second PMOS transistor, wherein the gate of the third PMOS transistor receives the scan clock signal;
a fourth PMOS transistor that is coupled in series with the third PMOS transistor, wherein the gate of the fourth PMOS transistor is coupled to the NOR gate;
a second NMOS transistor that is coupled in series with the fourth PMOS transistor, wherein the gate of the second NMOS transistor is coupled to the first inverter;
a third NMOS transistor that is coupled in series with the second NMOS transistor, wherein the gate of the third NMOS transistor is coupled to the third inverter; and
a fourth NMOS transistor that is coupled in series with the third NMOS transistor, wherein the gate of the third NMOS transistor is coupled to the second inverter; and
a slave stage including:
input circuit that is coupled to the second inverter;
output logic that is coupled to input circuit and that provides a scan mode output.

22. The apparatus of claim 21, wherein the input circuit further comprises:
a fourth inverter that receives the clock signal;
a transmission gate that is coupled to the fourth inverter and to the third inverter;
a fifth inverter coupled to the transmission gate; and
a third tri-state inverter that is coupled in parallel to the transmission inverter and that is coupled to the input inverter.

23. The apparatus of claim 22, wherein the output logic further comprises:
a sixth inverter that is coupled to the transmission gate; and
an NAND gate that is coupled to the fifth inverter and that receives the enable signal.

24. The apparatus of claim 21, wherein the apparatus further comprises:
a fifth NMOS transistor that is couples in series with the first NMOS transistor, wherein the fifth NMOS transistor is adapted to receive a reset signal at its gate;
a fifth PMOS transistor that is coupled to the first and second tri-state inverters, wherein the fifth PMOS transistor is adapted to receive the reset signal at its gate; and
a sixth PMOS transistor that is coupled to input circuit, wherein the sixth PMOS transistor is adapted to receive the reset signal at its gate.

25. The apparatus of claim 21, wherein the apparatus further comprises:
a fifth PMOS transistor that is couples in series with the first PMOS transistor, wherein the fifth PMOS transistor is adapted to receive a preset signal at its gate;
a fifth NMOS transistor that is coupled to the first and second tri-state inverters, wherein the fifth NMOS transistor is adapted to receive the preset signal at its gate; and
a sixth NMOS transistor that is coupled to input circuit, wherein the sixth NMOS transistor is adapted to receive the preset signal at its gate.

26. An apparatus comprising:
a master stage that is adapted to receive a clock signal, a data signal, a enable signal, a scan data signal, and a scan clock signal, wherein the master stage includes:
   a first inverter that receives an enable signal;
   a first NAND gate that is coupled to the first inverter and that receives the clock signal;
   a third inverter that is coupled to the first NAND gate;
   a first tri-state inverter that receives the data signal and that is coupled to the first NAND gate and the third inverter;
   a fourth inverter that is receives the scan clock signal;
   a second tri-state inverter that receives the scan data and that is coupled to the fourth inverter;
   a fifth inverter that is coupled to the second tri-state inverter;
   a third tri-state inverter that is coupled in parallel to the fifth inverter and that is coupled to the fourth inverter;
   a second NAND gate that receives the enable signal and the clock signal;
   a sixth inverter that is coupled to the second NAND gate;
   a transmission gate that is coupled to the fifth inverter, the second NAND gate, and the sixth inverter; and
a slave stage including:
   input circuit that is coupled to the transmission gate and the first tri-state inverter;
   output logic that is coupled to input circuit and that provides a scan mode output.

27. The apparatus of claim 26, wherein the input circuit further comprises:
   a seventh inverter that is coupled to the transmission gate and the first tri-state inverter;
   an eighth inverter that receives the clock signal; and
   a fourth tri-state inverter that is coupled in parallel to the seventh inverter and that is coupled to the eighth inverter.

28. The apparatus of claim 27, wherein the output logic further comprises:
   a ninth inverter that is coupled to the transmission gate and first tri-state inverter; and
   a third NAND gate that is coupled to the seventh inverter and that receives the enable signal.

* * * * *

UNITED STATES PATENT AND TRADEMARK OFFICE
CERTIFICATE OF CORRECTION

PATENT NO. : 7,650,549 B2 Page 1 of 1
APPLICATION NO. : 11/174193
DATED : January 19, 2010
INVENTOR(S) : Branch et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1141 days.

Signed and Sealed this

Twenty-eighth Day of December, 2010

David J. Kappos
*Director of the United States Patent and Trademark Office*